United States Patent
Huang et al.

(10) Patent No.: US 12,431,417 B2
(45) Date of Patent: Sep. 30, 2025

(54) SEMICONDUCTOR PACKAGE AND METHOD OF MANUFACTURING THE SAME

(71) Applicant: Taiwan Semiconductor Manufacturing Company, Ltd., Hsinchu (TW)

(72) Inventors: Li-Hsien Huang, Hsinchu County (TW); An-Jhih Su, Taoyuan (TW); Der-Chyang Yeh, Hsin-Chu (TW); Hua-Wei Tseng, New Taipei (TW); Chiang Lin, Hsinchu (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/761,200

(22) Filed: Jul. 1, 2024

(65) Prior Publication Data

US 2024/0355721 A1  Oct. 24, 2024

Related U.S. Application Data

(60) Continuation of application No. 17/382,384, filed on Jul. 22, 2021, now Pat. No. 12,062,602, which is a
(Continued)

(51) Int. Cl.
*H01L 23/498* (2006.01)
*H01L 21/48* (2006.01)
(Continued)

(52) U.S. Cl.
CPC .... *H01L 23/49822* (2013.01); *H01L 21/4857* (2013.01); *H01L 21/568* (2013.01);
(Continued)

(58) Field of Classification Search
CPC .......... H01L 23/49822; H01L 21/4857; H01L 21/568; H01L 23/3128; H01L 23/49816; H01L 23/49827; H01L 25/105; H01L 2225/1041; H01L 2225/1058; H01L 23/5389; H01L 2224/32145; H01L 2224/48091; H01L 2224/48227; H01L 2224/73265; H01L 2224/73267; H01L 24/19; H01L 2221/68345;
(Continued)

(56) References Cited

U.S. PATENT DOCUMENTS

| 11,075,150 | B2 * | 7/2021 | Huang | ................ H01L 21/6835 |
| 12,062,602 | B2 * | 8/2024 | Huang | ............. H01L 23/49827 |
| 2017/0271248 | A1 * | 9/2017 | Chen | ................... H01L 23/5389 |

* cited by examiner

*Primary Examiner* — Tan N Tran
(74) *Attorney, Agent, or Firm* — JCIPRNET

(57) ABSTRACT

A semiconductor package includes a semiconductor die including an active surface and an electrical terminal on the active surface, and a redistribution circuitry disposed on the active surface of the semiconductor die and connected to the electrical terminal. A top surface of the redistribution circuitry includes a planar portion and a concave portion connected to the planar portion, the concave portion is directly over the electrical terminal, and a minimum distance measured from a lowest point of the concave portion to a virtual plane where the planar portion is located is equal to or smaller than 0.5 μm.

20 Claims, 12 Drawing Sheets

Related U.S. Application Data division of application No. 16/056,532, filed on Aug. 7, 2018, now Pat. No. 11,075,150.

(60) Provisional application No. 62/669,382, filed on May 10, 2018.

(51) Int. Cl.
*H01L 21/56* (2006.01)
*H01L 23/31* (2006.01)
*H01L 25/10* (2006.01)

(52) U.S. Cl.
CPC .... *H01L 23/3128* (2013.01); *H01L 23/49816* (2013.01); *H01L 23/49827* (2013.01); *H01L 25/105* (2013.01); H01L 2225/1041 (2013.01); H01L 2225/1058 (2013.01)

(58) Field of Classification Search
CPC . H01L 2221/68359; H01L 2224/04105; H01L 2224/12105; H01L 2224/18; H01L 2224/32225; H01L 2224/92244; H01L 2924/15313; H01L 2924/351; H01L 21/6835; H01L 21/4885; H01L 21/56; H01L 23/3107; H01L 23/5226; H01L 23/528
USPC .......................................................... 257/668
See application file for complete search history.

SEMICONDUCTOR PACKAGE AND METHOD OF MANUFACTURING THE SAME

PRIORITY CLAIM AND CROSS-REFERENCE

This application is a continuation application of and claims the priority benefit of a prior application Ser. No. 17/382,384, filed on Jul. 22, 2021, now allowed. The prior application Ser. No. 17/382,384 is a divisional application of and claims the priority benefit of a prior application Ser. No. 16/056,532, filed on Aug. 7, 2018. The prior application Ser. No. 16/056,532 claims the priority benefit of U.S. provisional application Ser. No. 62/669,382, filed on May 10, 2018. The entirety of each of the above-mentioned patent applications is hereby incorporated by reference herein and made a part of this specification.

BACKGROUND

It is known to make microelectronic conductor devices, such as semiconductor devices, using a redistribution layer to connect a bond pad and a solder bump that are laterally spaced apart. One such device is a wafer level chip scale package (WLCSP). The redistribution layers are formed by depositing an insulating layer over the discrete devices, patterning and etching contact openings into this layer, and then depositing conductive material into the openings. A conductive layer is applied over the insulating layer and patterned to form wiring interconnections between the device contacts, thereby creating a first level of basic circuitry. The circuits are then further interconnected by utilizing additional wiring levels laid out over additional insulating layers with conductive via pass through. Depending upon the complexity of the overall integrated circuit, several levels of wiring interconnections are used.

Electrolytic plating is used for forming redistribution layers on semiconductor devices, for example. In copper sulfate electrolytic plating for example, various additives including suppressors and promoters (called brighteners, carriers, levelers and the like) are added to the plating solution to obtain coating performance in terms of improved gloss, physical coating properties, throwing power, blind via hole filling and the like.

The above information disclosed in this Background section is only for enhancement of understanding of the background of the inventive concept and, therefore, it may contain information that does not form the prior art that is already known in this country to a person of ordinary skill in the art.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
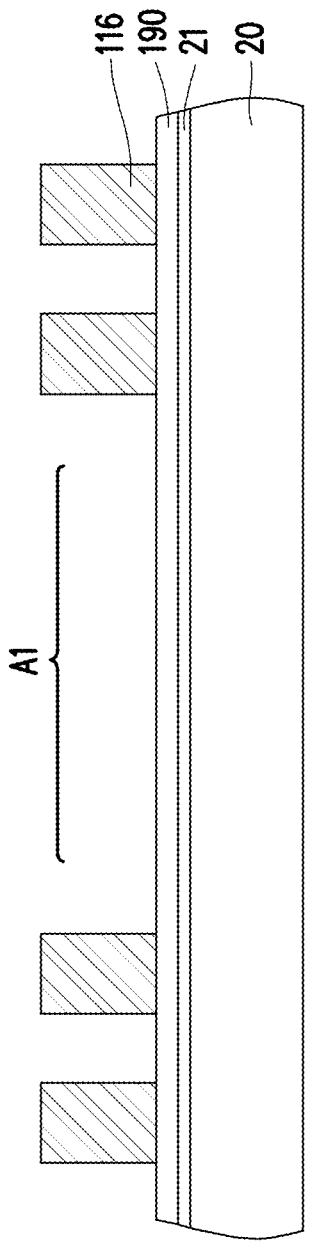
FIG. 1 to FIG. 9 illustrate schematic cross sectional views of various stages in the manufacturing process of a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 9 illustrate schematic cross sectional views of various stages in the manufacturing process of a semiconductor package in accordance with some embodiments. In exemplary embodiments, the manufacturing process of the semiconductor package disclosed herein may be part of a wafer level packaging process. In some embodiments, one semiconductor device is shown to represent plural semiconductor devices of the wafer, and one single package is shown to represent plural semiconductor packages obtained the following semiconductor manufacturing process. The manufacturing process of the semiconductor package 100 shown in FIG. 9 may include the following steps. Referring to FIG. 1, in some embodiments, a carrier 20 is provided. The carrier 20 may be a glass carrier or any suitable carrier for the manufacturing process of the semiconductor package 100. In some embodiments, the carrier 20 may be coated with a de-bonding layer 21. The material of the debond layer may be any material suitable for de-bonding the carrier 20 from the above layers disposed thereon. For example, the de-bonding layer 21 may be a ultra-violet (UV) curable adhesive, a heat curable adhesive, an optical clear adhesive or a light-to-heat conversion (LTHC) adhesive, or the like, although other types of de-bonding layer may be used. In addition, the de-bonding layer 21 may be also adapted to allow light or signal to pass through. It is noted that the materials of the de-bonding layer 21 and the carrier 20 are merely for illustration, and the disclosure is not limited thereto.

In some embodiments, the carrier 20 may further include a dielectric layer 190 formed thereon. The dielectric layer 190 may be a polybenzoxazole (PBO) layer formed on the de-bonding layer 21, for example. It is noted that, in some embodiments, the dielectric layer 190 may be omitted. In other words, the formation of the dielectric layer 190 is optional in some alternative embodiments.

Then, a plurality of conductive pillars 116 may be formed on the carrier 20. In some embodiments, the conductive pillars 116 are formed over the carrier 20 (e.g. on the dielectric layer 190, or on the de-bonding layer 21 if the dielectric layer 190 is omitted) by photolithography, plating, and photoresist stripping process, etc. In some alternative embodiments, the conductive pillars 116 may be pre-fabricated through other processes and then be mounted over the carrier 20. For example, the conductive pillars 116 may be copper posts or other metallic posts. In some embodiments, the conductive pillars 116 may surround a device mounting area A1 where the semiconductor device 112' is disposed.

Figure 2:
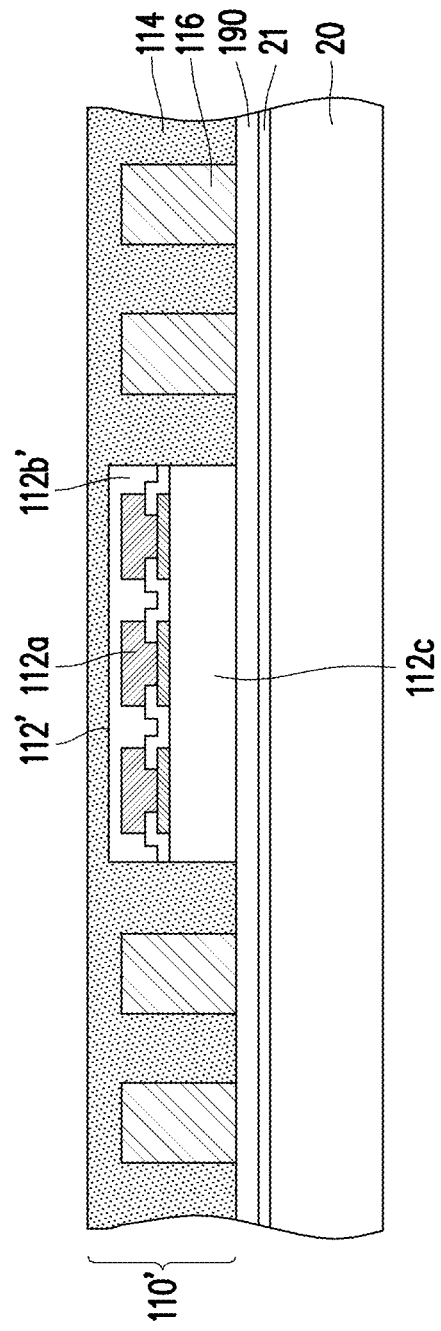

Referring to FIG. 2, in some embodiments, at least one semiconductor device 112' may be disposed on the device mounting area A1 of the carrier 20. The semiconductor device 112' may be attached or adhered over the carrier 20 (e.g. on the dielectric layer 190, or on the de-bonding layer 21 if the dielectric layer 190 is omitted) through a die attach film (e.g. the die attach film 12 illustrated in FIG. 12), an adhesion paste or the like. In some embodiments, the semiconductor device 112' may include a plurality of electrical terminals 112a, a substrate 112c and an insulation layer 112b'. The electrical terminals 112a are disposed on an active surface of a substrate 112c and the insulation layer 112b' covers the active surface of the substrate 112c and the electrical terminals 112a disposed thereon. In some alternative embodiments, the insulation layer 112b' may reveal the electrical terminals 112a. In the present embodiment, the semiconductor device 112' is disposed on the carrier 20 with the active surface facing away from the carrier 20 (i.e. facing up). In some embodiments, the conductive pillars 116 are arrange aside and around the semiconductor device 112'. In some alternative embodiments, more than one of the semiconductor devices 112' may be disposed on the carrier 20, and the conductive pillars 116 may surround a device mounting area where the semiconductor devices 112' are disposed, or surround each of the semiconductor devices 112'. The disclosure does not limit the number of the semiconductor device 112' being disposed on the carrier 20 and the arrangement of the conductive pillars 116.

Then, an encapsulating material 114' is formed on the carrier 20 and encapsulates the semiconductor device 112' and the conductive pillars 116. In some embodiments, the encapsulating material 114' fills the gaps between the semiconductor device 112' and the conductive pillars 116, and covers a top surface of the carrier 20. In some embodiments, the encapsulating material 114' is a single-layered encapsulating material, which may include a molding compound formed by a molding process. The material of the encapsulating material 114' may include epoxy or other suitable resins. For example, the encapsulating material 114' may be epoxy resin containing chemical filler. In some embodiments, the encapsulating material 114' is formed over the semiconductor device 112' and covers the top surfaces of the conductive pillars 116 and the top surface of the semiconductor device 112' (e.g. the top surface of the insulation layer 112b'), so as to form an encapsulated semiconductor device 110' on the carrier 20.

Figure 3:
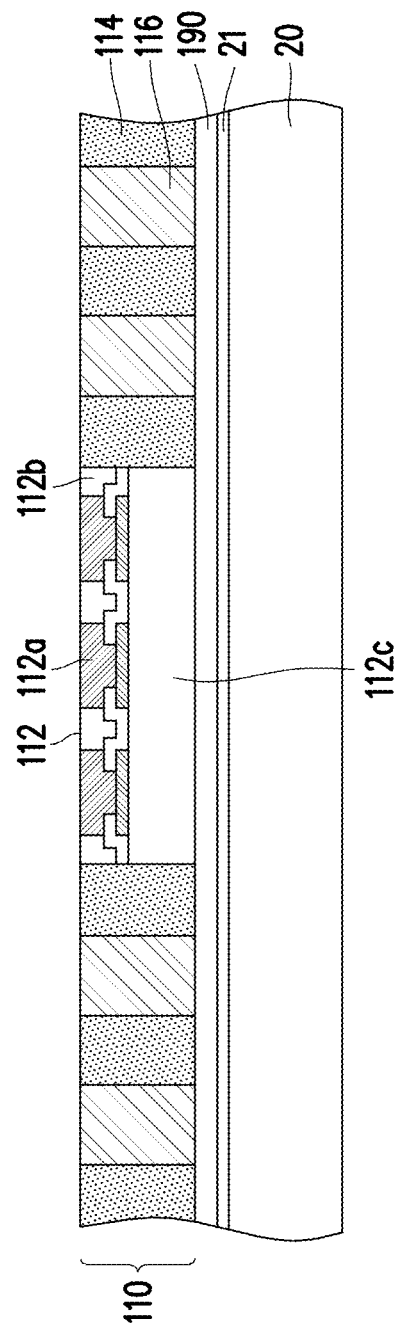

Referring to FIG. 2 and FIG. 3, in some embodiments, a thinning process is performed on a top surface of the encapsulated semiconductor device 110'. Accordingly, the encapsulating material 114' is ground to reveal the conductive pillars 116 and the electrical terminals 112a of the semiconductor device 112. In the embodiment of the insulation layer 112b' covering the electrical terminals 112a, the insulation layer 112b' shown in FIG. 2 is also ground to form the insulation layer 112b shown in FIG. 3 for revealing the electrical terminals 112a underneath. In some embodiments, the thinning process may be, for example, a mechanical grinding or CMP process whereby chemical etchants and abrasives are utilized to react and grind away the encapsulating material 114' and the semiconductor device 112'. The resulting structure is shown in FIG. 3. After the thinning process is performed, the top surface of the semiconductor device 112 is substantially level with the top surface of the encapsulating material 114 as shown in FIG. 3. However, while the CMP process described above is presented as one illustrative embodiment, it is not intended to be limiting to the embodiments. Any other suitable removal process may alternatively be used to thin the encapsulating material 114' and the semiconductor device 112'. For example, a series of chemical etches may alternatively be utilized. This process and any other suitable process may alternatively be utilized, and all such processes are fully intended to be included within the scope of the embodiments.

In some embodiment, the top surface of the encapsulated semiconductor device 110' are ground and polished until the conductive pillars 116 and the electrical terminals 112a of the semiconductor device 112 are revealed. In some embodiments, the tips of the conductive pillars 116 and/or the tips of the electrical terminals 112a may also be ground to obtain a substantially planar surface. Accordingly, a ground surface of the encapsulating material 114 is substantially coplanar with the top surfaces of the conductive pillars 116 and the electrical terminals 112a of the semiconductor device 112.

Throughout the description, the resultant structure including the semiconductor device 112, the encapsulating material 114, and the conductive pillars 116 extending through the encapsulating material 114 as shown in FIG. 3 is referred to as the encapsulated semiconductor device 110, which may have a wafer form in the process. Accordingly, in the encapsulated semiconductor device 110, the encapsulating material 114 encapsulates the semiconductor device 112 and the conductive pillars 116 and reveals the top surfaces of the conductive pillars 116 and the top surfaces of the electrical terminals 112a of the semiconductor device 112. After the thinning process, a cleaning step may be optionally performed, for example, to clean and remove the residue generated from the thinning process.

Figure 4:
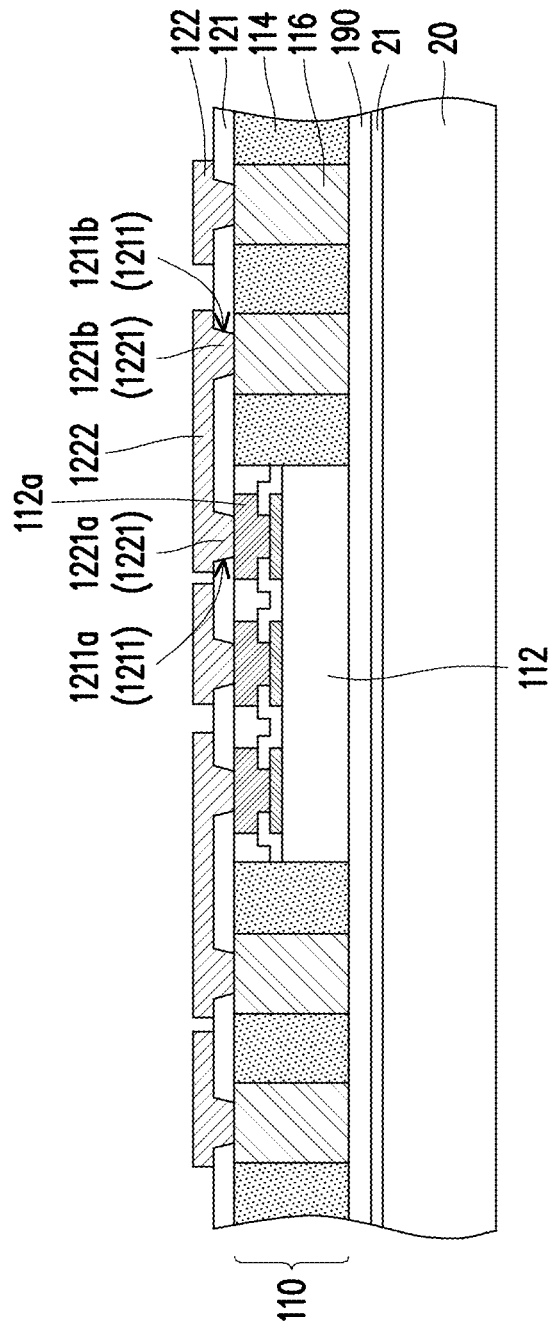
Figure 5:
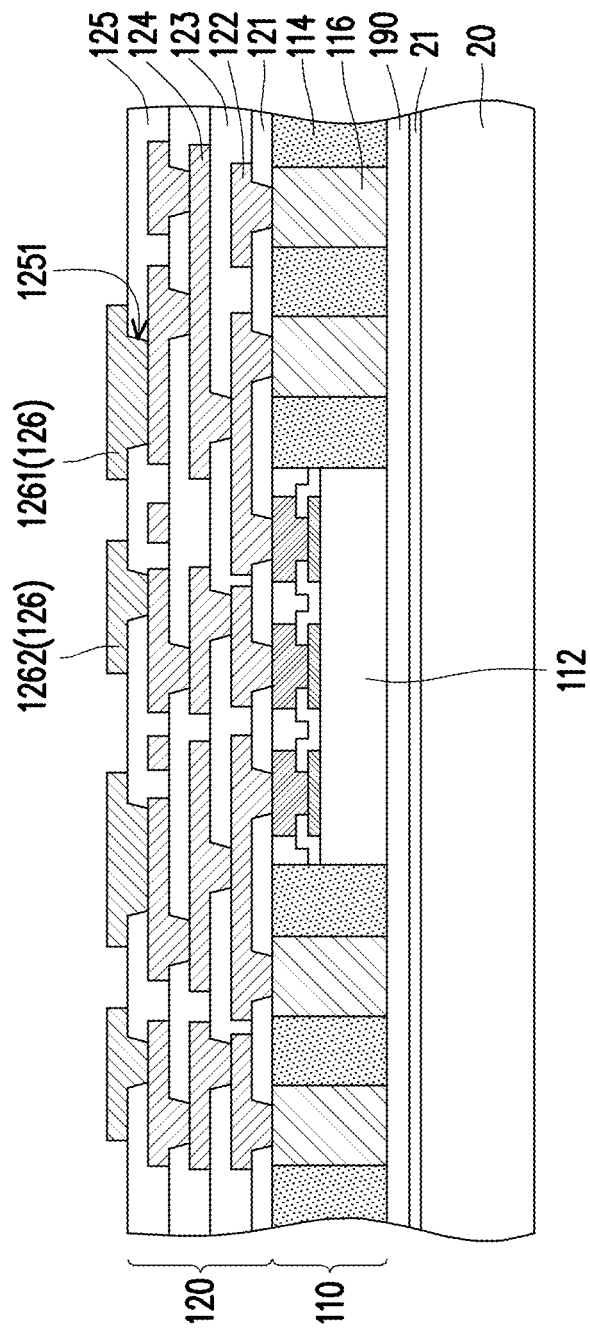

Referring to FIG. 4 and FIG. 5, a redistribution structure 120 is formed over the encapsulated semiconductor device 110. In some embodiments, the redistribution structure 120 is formed on the encapsulating material 114 and semiconductor device 112. The redistribution structure 120 is electrically connected to the conductive pillars 116 and the electrical terminals 112a of the semiconductor device 112. Namely, the conductive pillars 116 are electrically connected to the electrical terminals 112a of the semiconductor device 112 through the redistribution structure 120. In some embodiments, a plurality of dielectric layers and a plurality of redistribution circuit layers may be stacked on top of one another alternately to form the redistribution structure 120 shown in FIG. 5. The redistribution structure 120 at least includes a first dielectric layer 121 and a first redistribution circuit layer 122 electrically connected to the semiconductor device 112 and the conductive pillars 116. In some embodiments, the formation of the redistribution structure 120 may include the follow steps.

In some embodiments, a first dielectric layer 121 is formed on the encapsulated semiconductor device 110. The material of the first dielectric layer 121 of the redistribution structure 120 may include organic polymer such as, but not limited to, polyimide, etc. The first dielectric layer 121 includes at least one first via opening 1211. In some embodiments, the first dielectric layer 121 may include a plurality of first via openings 1211a, 1211b. For example, one of the first via openings 1211a is substantially aligned with one of the electrical terminals 112a, and another one of the first via openings 1211b is substantially aligned with one of the conductive pillars 116. In one of the embodiments, the term "substantially aligned" means that the via openings at least partially reveals the structure underneath (e.g. the electrical terminals 112a and/or the conductive pillars 116).

Then, a first redistribution circuit layer 122 is formed on the first dielectric layer 121. In some embodiments, the first redistribution circuit layer 122 fills the first via openings 1211a, 1211b to form the via portions 1221a, 1221b and connects between the first via openings 1211a, 1211b. The material of the first redistribution circuit layer 122 may include copper, or any other suitable materials. In some embodiments, the first redistribution circuit layer 122 is formed by a plating process, which is carried out at a current density of substantially from 4 amperes per square decimeter (ASD) to 6 ASD. The current density adopted herein is higher than a regular current density (e.g. about 1 ASD) adopted for forming a conventional redistribution circuit layer. Thereby, the plating speed and the production efficiency in the present embodiment is increased, which results in saving overall production cost of the semiconductor package 100. For example, the production efficiency (e.g. wafer per hour) in the present embodiment is increased by 3 times the production efficiency of the conventional plating process, which may lead to 1% of wafer production cost reduction. When utilizing the current density of 4~6 ASD in plating, it is proven by experiments that the resultant structure (e.g. the first redistribution circuit layer 122) is characterized by being rough (or semi-bright) on its surface, low-stressed and strong in mechanical strength while having acceptable signal and power integrity.

In the plating process carried out at the current density of 4~6 ASD, the plating speed is increased, so immersion time of electroplating bath is shorten. In addition, there is no need to add additives, such as brightener, leveling agent, intermediate, etc., into the electroplating bath for improving the performance of electroplating baths. Accordingly, impurities, such as C, N, O, S, Cl, etc., in the resultant structure (e.g. the first redistribution circuit layer 122) can be significantly reduced. Thereby, void formation of redistribution circuit layer, which leads to crack of redistribution circuit layer, can be avoided or at least significantly reduced. Therefore, the resultant structure (e.g. the first redistribution circuit layer 122) can have stronger mechanical strength.

In some embodiments, a grain size of the first redistribution circuit layer 122 substantially ranges from 350 nm to 700 nm. For example, a grain size of the first redistribution circuit layer 122 is, for example but not limited thereto, about 581 nm. Accordingly, the first redistribution circuit layer 122 may have a rather rough outer surface. For example, a surface roughness of the upper surface of the first redistribution circuit layer 122 substantially ranges from 80 nm to 200 nm. In one of the embodiments, the surface roughness of the upper surface of the first redistribution circuit layer 122 is, for example but not limited thereto, about 154 nm. As such, owing to the first redistribution circuit layer 122 having rough outer surface, bonding strength between the dielectric layers and the first redistribution circuit layer 122 can be improved, so as to avoid or at least reduce risk of delamination in the redistribution structure 120.

Figure 11:
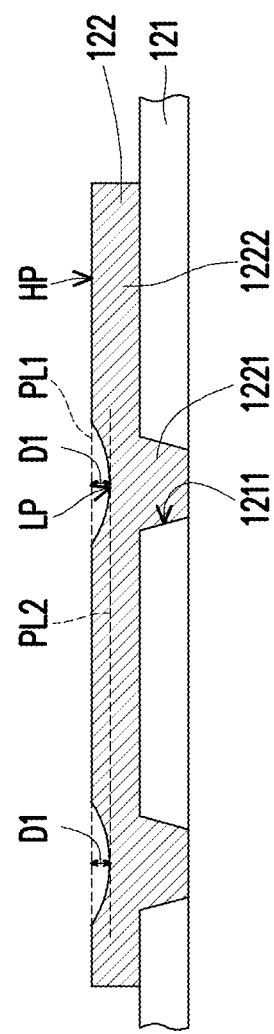
FIG. 11 illustrate a partial enlarged view of a redistribution structure in accordance with some embodiments.

FIG. 11 illustrate a partial enlarged view of a redistribution structure in accordance with some embodiments. It is noted that FIG. 11 shows a partial enlarged view of the first redistribution circuit layer 122 in FIG. 4. Referring to FIG. 4 and FIG. 11, when it comes to structural characteristics of the first redistribution circuit layer 122 formed by the plating process described above, an upper surface of the first redistribution circuit layer 122 filling the first via openings 1211 is substantially coplanar with an upper surface of the rest of the first redistribution circuit layer 122. That is to say, an upper surface of the via portions 1221a, 1221b is substantially coplanar with an upper surface of the rest of the first redistribution circuit layer 122 as it is shown in FIG. 4. It is noted that the upper surface of the first redistribution circuit layer 122 is illustrated as a planar surface in FIG. 4. However, it should be understood by one of ordinary skills in the art that the upper surface of the via portions 1221a, 1221b can be slightly lower (e.g. height difference being equal to or under 0.5 μm) than the upper surface of the rest of the first redistribution circuit layer 122 as it is shown in FIG. 11. Such structural characteristics may reduce stress concentration on the first redistribution circuit layer 122, so as to further improve the mechanical strength of the first redistribution circuit layer 122. In one of the embodiments, the term "substantially coplanar" means that a vertical distance D1 is substantially equal to or smaller than 0.5 μm. For example, the vertical distance D1 is between a plane PL1 where a highest point HP of an upper surface of the first redistribution circuit layer 122 is located and a plane PL2 where a lowest point LP of the upper surface of the first redistribution circuit layer 122 is located.

In some embodiments, the first redistribution circuit layer 122 may include a via portion 1221 and a circuit portion 1222. The via portion 1221 fills the first via opening 1121 and the circuit portion 1222 connects the via portion 1221 and extends over the first dielectric layer 121. Accordingly, the vertical distance D1 is the distance between a lowest point of the upper surface of the via portion 1221 and a highest point of an upper surface of the circuit portion 1222. That is to say, in such embodiment, a maximum vertical distance D1 between an upper surface of the via portion 1221 and an upper surface of the circuit portion 1222 is substantially equal to or smaller than 0.5 μm.

Similar process may be repeated to form the redistribution structure 120 shown in FIG. 5 with a plurality of dielectric layers (e.g. dielectric layers 121, 123, 125) and a plurality of redistribution circuit layers (e.g. redistribution circuit layers 122, 124, 126) stacked on top of one another. In some embodiments, the rest of the redistribution circuit layers (e.g. redistribution circuit layers 124, 126) may also be formed with the plating process described above (i.e. carried out at the current density of 4~6 ASD). Accordingly, the rest of the redistribution circuit layers (e.g. redistribution circuit layers 124, 126) in the redistribution structure 120 can have the same characteristics as the first redistribution circuit layer 122 has. It is noted that the upper surface of each of the redistribution circuit layers in the redistribution structure 120 are illustrated as a planar surface in FIG. 5. However, it should be understood by one of ordinary skills in the art that the upper surfaces of the via portions filling the via openings can be slightly lower (e.g. height difference being equal to or under 0.5 μm) than the upper surface of the rest of the redistribution circuit layers as it is shown in FIG. 11.

In alternative embodiments, similar plating process (i.e. carried out at the current density of 4~6 ASD) may be applied to a backside redistribution layer (RDL) process for forming the redistribution circuit layers in the backside RDL. Accordingly, the redistribution circuit layers in the semiconductor package with backside RDL can have the same characteristics as the first redistribution circuit layer 122 has. Namely, the upper surface (the surface facing the semiconductor device 112) of the redistribution circuit layer in the backside RDL is a substantially planar surface (e.g. height difference being equal to or under 0.5 μm). In some embodiments, the upmost redistribution circuit layer in the backside RDL may be formed by a plating process with lower ASD (e.g. about 1 ASD), and the rest of the redistribution circuit layers in the backside RDL can be formed by the plating process with higher ASD (e.g. about 4~6 ASD) as described before. Accordingly, the via portion of such upmost redistribution circuit layer may have a dent on the upper surface, and the depth of the dent can be greater than 0.5 μm (about 5 μm, for example). Such dent can facilitate solder material to be disposed and gathered thereon. The upper surfaces of the rest of the redistribution circuit layers in the backside RDL can be substantially planar surfaces (e.g. height difference being equal to or under 0.5 μm).

In an alternative embodiment, the rest of the redistribution circuit layers (e.g. redistribution circuit layers 124, 126) can be formed by a plating process with lower ASD (e.g. about 1 ASD). Accordingly, the vertical distance D1 between the highest point of the upper surface of such redistribution circuit layer and the lowest point of the upper surface of such redistribution circuit layer may be greater than 0.5 μm. For example, such vertical distance may be about 5 μm. However, the disclosure is not limited thereto.

In some embodiments, the redistribution circuit layer 126 may include at least one under bump metallurgy (UBM) layer 1261 (a plurality of under bump metallurgy layers 1261 are illustrated) for further electrical connection. In detail, a (third) dielectric layer 125 is formed over the first redistribution circuit layer 122 and the dielectric layer 125 includes at least one bump opening 1251 (a plurality of bump openings 1251 are illustrated herein). Then, the under bump metallurgy layer 126 is formed on the dielectric layer 125 and fills the bump opening 1251 to be connected to the underlying redistribution circuit layer revealed by the bump opening 1251. Then, at least one conductive bump 130 (a plurality of conductive bumps 130 are illustrated herein) is disposed on the bump opening 1251. In some embodiments, the redistribution circuit layer 126 may further include at least one connecting pad 1262 (a plurality of connecting pads 1262 are illustrated).

Figure 6:
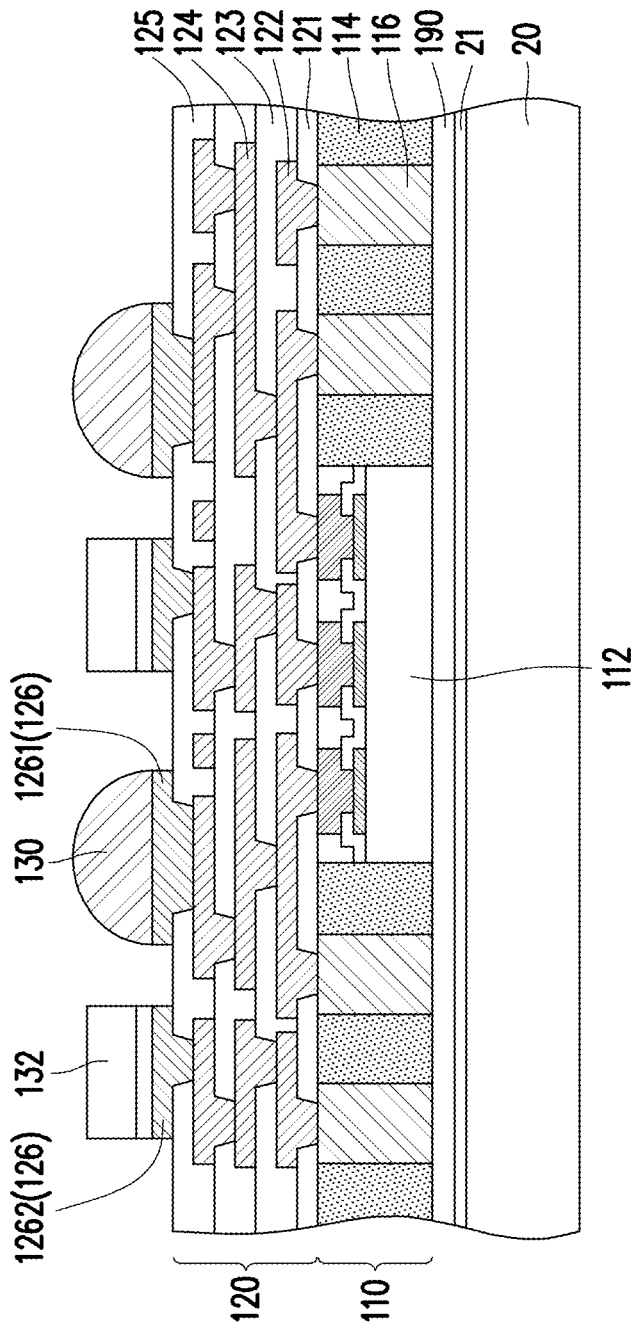

Referring to FIG. 6, in some embodiments, at least one conductive bump 130 (a plurality of conductive bumps 130 are illustrated) is disposed on the under bump metallurgy layer 1261, and at least one integrated passive device (IPD) 132 (a plurality of integrated passive devices 132 are illustrated) is formed on the connecting pad 1262. The conductive bump 130 and the integrated passive device 132 are electrically connected to the first redistribution circuit layer 122. The formation of the conductive bump 130 may include placing solder ball on the under bump metallurgy layer 1261, and then reflowing the solder ball. In alternative embodiments, the formation of the conductive bump 130 may include performing a plating process to form solder material on the under bump metallurgy layer 1261, and then reflowing the solder material. The conductive bump 130 may also include conductive pillars, or conductive pillars with solder caps, which may also be formed through plating.

The integrated passive device 132 may be fabricated using standard wafer fabrication technologies such as thin film and photolithography processing, and may be mounted on the connecting pad 1262 through, for example, flip-chip bonding or wire bonding, etc.

Figure 7:
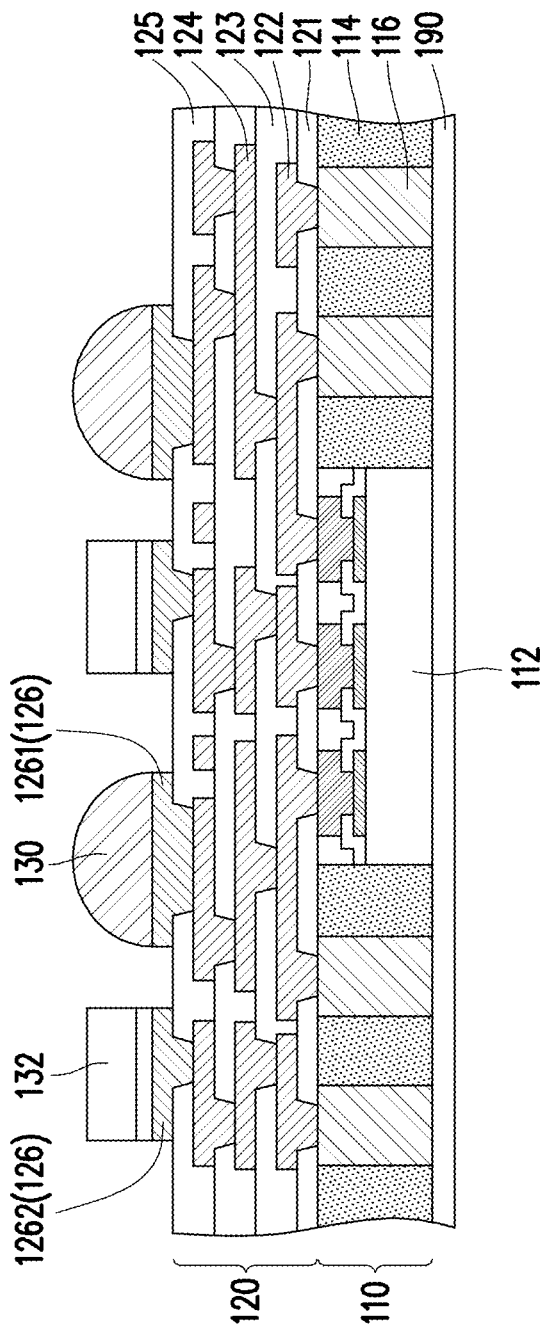

Referring to FIG. 6 and FIG. 7, the carrier 20 shown in FIG. 6 may be removed. In some embodiments, the carrier 20 is detached from the encapsulated semiconductor device 110 and the dielectric layer 190 (if any), by causing the de-bonding layer 21 to lose or reduce adhesion. The de-bonding layer 21 is then removed along with the carrier 20. For example, the de-bonding layer 21 may be exposed to UV light, so that the de-bonding layer 21 loses or reduces adhesion, and hence the carrier 20 and the de-bonding layer 21 can be removed from the encapsulated semiconductor device 110 and the dielectric layer 190 (if any).

Figure 8:
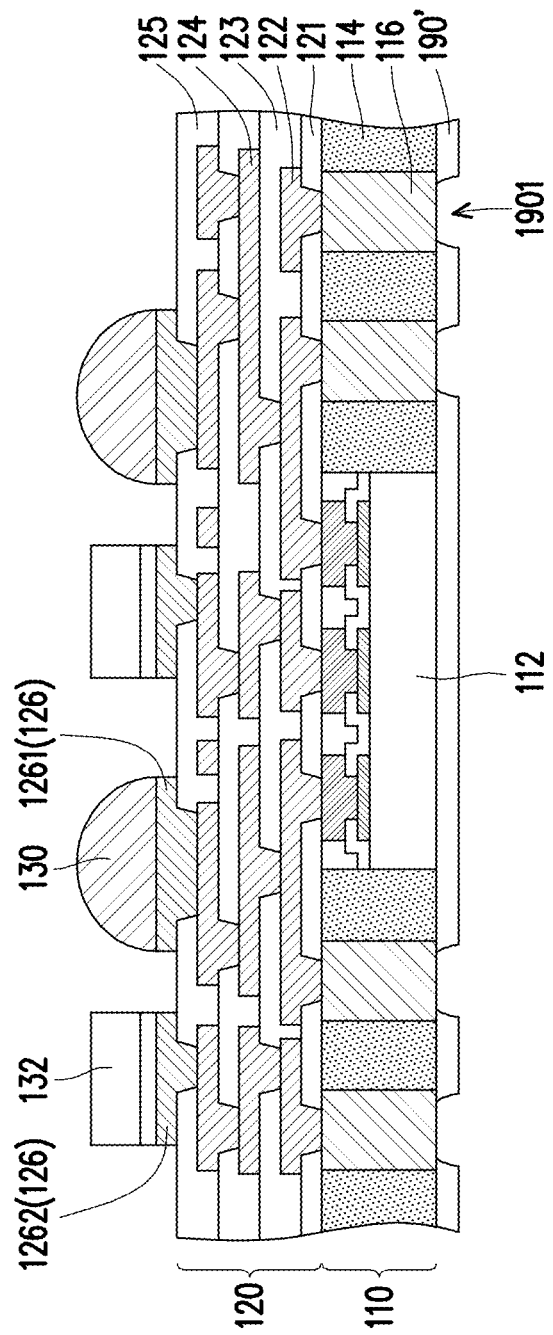

With now reference to FIG. 8, in the embodiments of having the dielectric layer 190, a patterning process may then be performed on the dielectric layer 190 to form a plurality of openings 1901. Accordingly, the dielectric layer 190' having a plurality of openings 1901 are formed. The openings 1901 are substantially aligned with the conductive pillars 116 respectively to reveal the bottom ends of the conductive pillars 116. In some embodiments, the openings 1901 may be formed by photolithography process, laser drilling process, etc.

Figure 9:
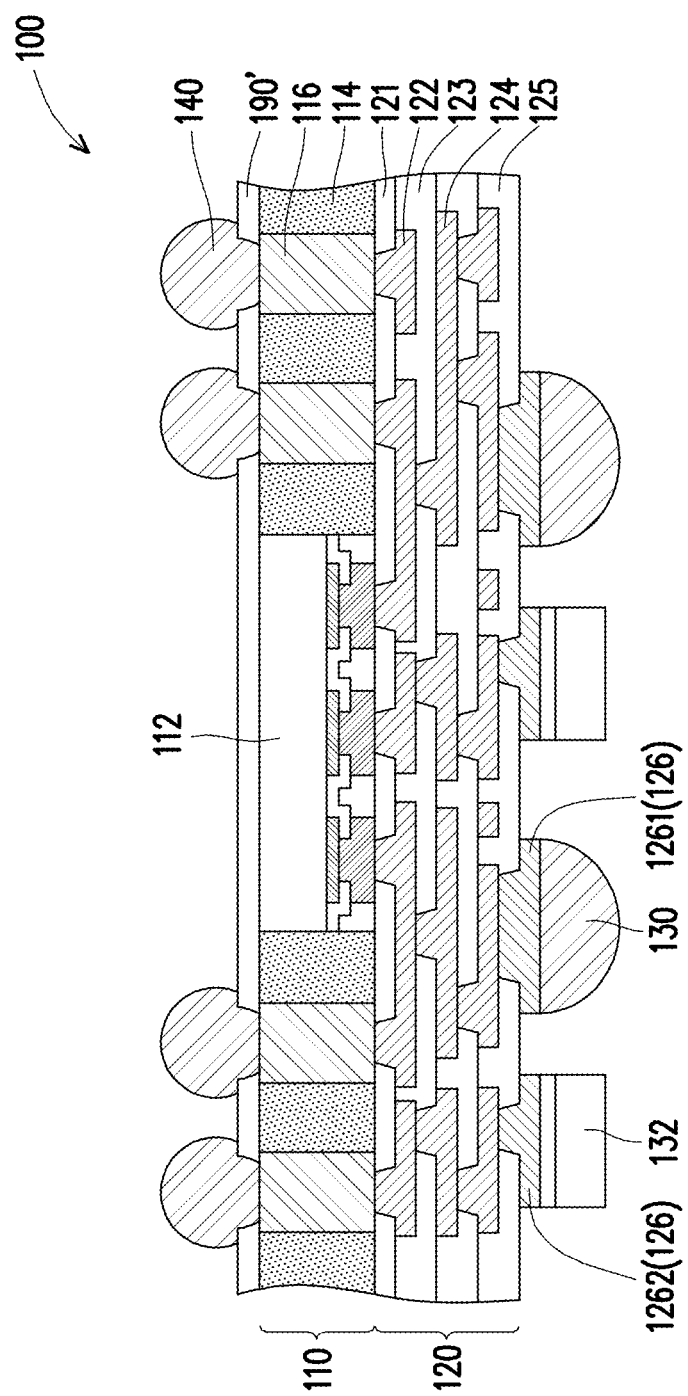

Referring to FIG. 9, a plurality of conductive bumps 140 may be provided on the encapsulated semiconductor device 110 to be electrically connected to the conductive pillars 116. In some embodiments, the conductive bumps 140 are disposed in the openings 1901 of the dielectric layer 190' to be connected to the conductive pillars 116. At the time, the semiconductor package 100 may be substantially formed. In the embodiment without the dielectric layer 190 formed on the carrier 20, the conductive bumps 140 may be directly provided on the encapsulated semiconductor device 110 to be electrically connected to the conductive pillars 116.

Figure 10:
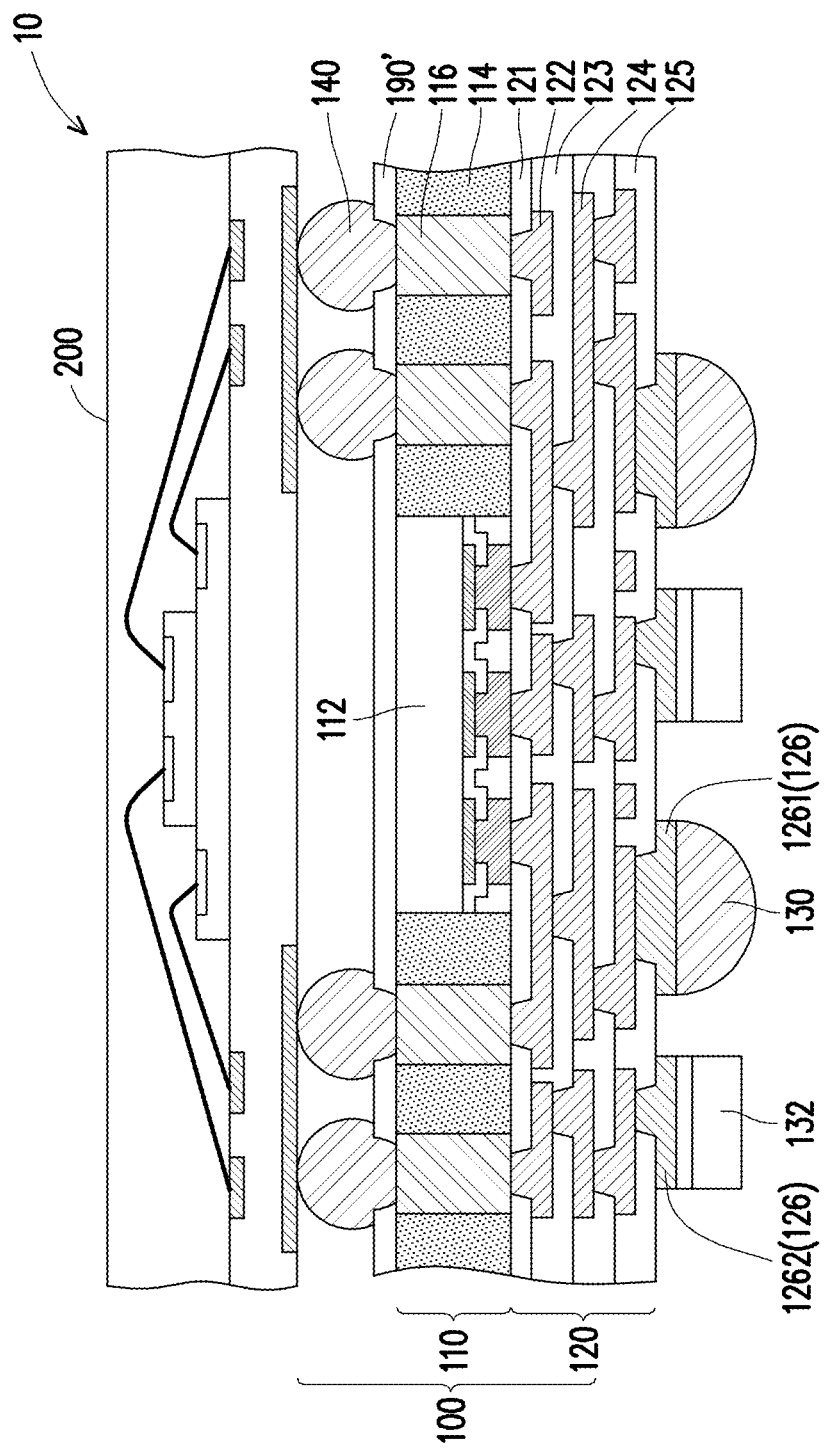
FIG. 10 illustrate a schematic cross sectional view of a semiconductor package in accordance with some embodiments.

FIG. 10 illustrate a schematic cross sectional view of a semiconductor package in accordance with some embodiments. With now reference to FIG. 10, in some embodiments, another semiconductor device 200 may be disposed on the conductive bumps 140, and the semiconductor device 200 is electrically connected to the conductive pillars 116 through the conductive bumps 140. In other words, the semiconductor device 200 is mounted on the encapsulated semiconductor package 110 through the conductive bumps 140. In some embodiments, the semiconductor device 200 may be packages, device dies, passive devices, and/or the like. In some embodiments, the semiconductor package 100 may combine vertically discrete memory and logic packages, and the semiconductor device 200 may be employed in a memory such as Dynamic Random Access Memory and others, but the disclosure is not limited thereto. At the time, a package on package (POP) structure 10 may be substantially formed.

Figure 12:
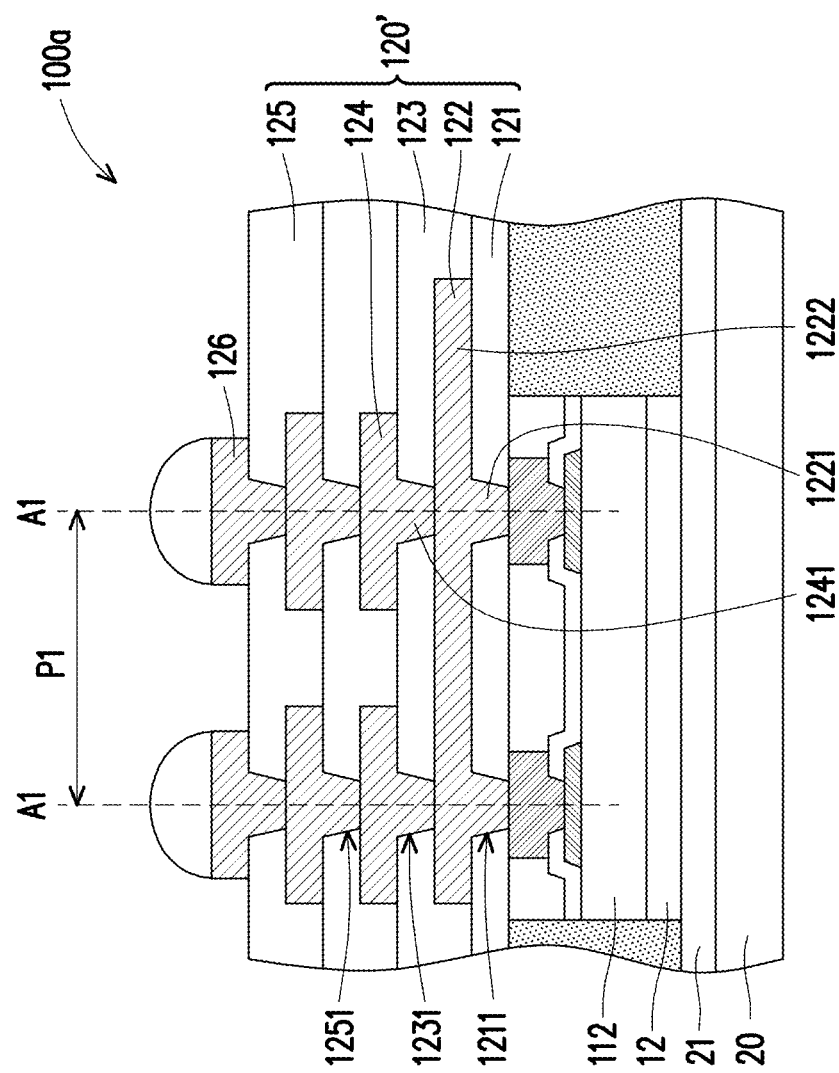
FIG. 12 illustrate a partial cross sectional view of a semiconductor package in accordance with some embodiments.

FIG. 12 illustrate a partial cross sectional view of a semiconductor package in accordance with some embodiments. It is noted that the semiconductor package 100a shown in FIG. 12 contains many features same as or similar to the semiconductor package 100 disclosed earlier with FIG. 1 to FIG. 10. For purpose of clarity and simplicity, detail description of same or similar features may be omitted, and the same or similar reference numbers denote the same or like components. The main differences between the semiconductor package 100a shown in FIG. 12 and the semiconductor package 100 regarding FIG. 1 to FIG. 10 are described as follows.

With now reference to FIG. 12, in some embodiments, the formation of the redistribution structure may include the following steps. After forming the first redistribution circuit layer 122, a second dielectric layer 123 is then formed on the first redistribution circuit layer 122, and the second dielectric layer 123 includes at least one second via opening 1231 (a plurality of second via openings 1231 are illustrated, but not limited thereto). In some embodiments, the second via opening 1231 is substantially aligned with the first via opening 1211 of the first dielectric layer 121. Herein, the term "substantially aligned" means that the second via opening 1231 at least partially reveals the first via opening 1211 and/or the via portion 1221 underneath. Then, a second redistribution circuit layer 124 is formed on the second dielectric layer 123, and the second redistribution circuit layer 124 fills the second via opening 1231 to form the via portion 1241. By forming the first redistribution circuit layer 122 with higher ASD (e.g. 4~6 ASD), the structural characteristics of the first redistribution circuit layer 122 (e.g. an upper surface of via portion 1221 being substantially coplanar with an upper surface of the circuit portion 1222) allows the via portion 1241 to be stacked directly onto the via portion 1221. In other words, the via portion 1241 is able to be substantially aligned with the via portion 1221 along an axis A1. Thereby, flexibility of layout design of the redistribution structure 120' can be improved.

In some embodiments, the second redistribution circuit layer 124 may also be formed by a plating process carried out at a current density of substantially from 4 ASD to 6 ASD. Accordingly, the upper surface of the second redistribution circuit layer 124 fills the second via opening 1231 (e.g. the via portion 1241) is substantially coplanar with the upper surface of the rest of the second redistribution circuit layer 124. Herein, the term "substantially coplanar" means that a vertical distance (e.g. vertical distance D1) between a highest point of an upper surface of the first redistribution circuit layer 122 and a lowest point of the upper surface of the first redistribution circuit layer 122 is substantially equal to or smaller than 0.5 µm. Thereby, the via portion of the redistribution circuit layer sequentially formed thereon can be directly stacked on top of the via portion 1241 of the second redistribution circuit layer 124.

In the present embodiment, each of the redistribution circuit layers in the redistribution structure 120' is formed by the plating process carried out at the current density of substantially from 4 ASD to 6 ASD, so the via portions of the redistribution circuit layers in the redistribution structure 120' can be stacked on top of one another. Namely, the via portions of the redistribution circuit layers are substantially aligned with one another. Accordingly, in some embodiments, the third dielectric layer 125 (e.g. the topmost dielectric layer) may include at least one bump opening 1251 (a plurality of bump openings 1251 are illustrated). In the present embodiment, the bump opening 1251 is substantially aligned with the first via opening 1211, and at least one conductive bump 130 (a plurality of conductive bumps 130 are illustrated) is disposed on the bump opening 1251 to be aligned with the first via opening 1211 and electrically connected to the first redistribution circuit layer 122. With such configuration, since the via portions of the redistribution circuit layers in the redistribution structure 120' are substantially aligned with one another instead of being staggered from one another to avoid via stacking, the pitch P1 between adjacent two of the conductive bumps 130 can be reduced. For example, the pitch P1 between adjacent two of the conductive bumps 130 substantially ranges from 20 µm to 100 µm. In one of the implementations, the pitch P1 can be substantially smaller than 80 µm.

Figure 13:
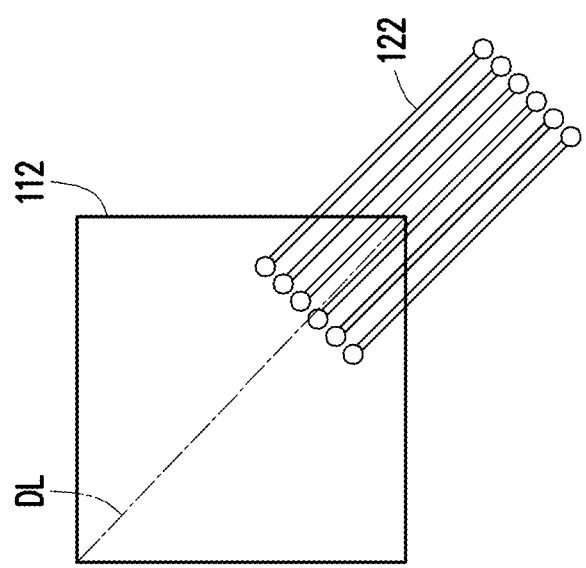
FIG. 13 illustrate a schematic top view of redistribution circuit layer and a semiconductor device of a semiconductor package in accordance with some embodiments.

FIG. 13 illustrate a schematic top view of redistribution circuit layer and a semiconductor device of a semiconductor package in accordance with some embodiments. It is noted that other elements of the semiconductor package may be omitted in FIG. 13 for purposes of clarity and simplicity. In general, due to the inherent mismatch in Coefficient of Thermal Expansion (CTE) between the metal such as copper and the semiconductor material such as silicon, stress develops in the vicinity of the circuits when the system undergoes a temperature change, such as cooling down from the copper annealing temperature to the room temperature. Such stress has a significant impact on the device performance. The stress caused by CTE mismatch is usually at their strongest along a diagonal of the encapsulated semiconductor device (e.g. the encapsulated semiconductor device 110 in FIG. 9). Therefore, a keep out zone (KOZ) is usually imposed around the diagonal region of the encapsulated semiconductor device.

With now reference to FIG. 13, in some embodiments, the redistribution circuit layer (e.g. the first redistribution circuit layer 122) formed by the plating process with higher ASD (e.g. 4~6 ASD) inherent the characteristics of having strong mechanical strength. Thereby, such redistribution circuit layer can withstand higher stress, such that unnecessary keep out zone can be eliminated or reduced. Accordingly, in the present embodiment, the first redistribution circuit layer 122 is extended along a direction parallel to a diagonal DL of an upper surface of the semiconductor device 112 without having to impose any keep out zone. Therefore, by forming the redistribution circuit layers with higher ASD (e.g. 4~6 ASD), flexibility of layout design of the redistribution circuit layers can be improved.

In sum, the redistribution circuit layer of the redistribution structure is formed by a plating process carried out at a current density of about 4~6 ASD. As such, the resultant structure (e.g. the redistribution circuit layer) is characterized by the upper surface of the redistribution circuit layer fills the via opening being substantially coplanar with the upper surface of the rest of the redistribution circuit layer. With such structural characteristics, the via portions of the redistribution circuit layers can be stacked on top of one another (i.e. aligned with one another), which improves flexibility of layout design of the redistribution circuit layers. Moreover, since the via portions of the redistribution circuit layers are substantially aligned with one another instead of being staggered from one another, the pitch between adjacent two of the conductive bumps, which is disposed on the topmost via portion of the redistribution circuit layer, can be reduced.

In addition, the redistribution circuit layer formed with higher ASD (e.g. 4~6 ASD) is also characterized by being rough (or semi-bright) on its surface, low-stressed and strong in mechanical strength while having acceptable signal and power integrity. Owing to the rough outer surface of such redistribution circuit layer, bonding strength between the dielectric layers and the redistribution circuit layer can be improved, so as to avoid or at least reduce risk of delamination in the redistribution structure. Furthermore, Owing to the strong mechanical strength of such redistribution circuit layer, unnecessary keep out zone for avoiding circuit crack can be eliminated or reduced, so as to further improve flexibility of layout design of the redistribution circuit layers.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a semiconductor package includes an encapsulated semiconductor device and a redistribution structure. The redistribution structure is disposed over the encapsulated semiconductor device and electrically connected to the encapsulated semiconductor device. The redistribution structure includes a first dielectric layer and a first redistribution circuit layer. The first dielectric layer includes a first via opening. The first redistribution circuit layer is disposed on the first dielectric layer and includes a via portion filling the first via opening and a circuit portion connecting the via portion and extending over the first dielectric layer. A maximum vertical distance between an upper surface of the via portion and an upper surface of the circuit portion is substantially equal to or smaller than 0.5 µm.

In accordance with some embodiments of the disclosure, a semiconductor package includes an encapsulated semiconductor device and a redistribution structure. The encapsulated semiconductor device includes a semiconductor device encapsulated by an encapsulating material. The redistribution structure is disposed over the encapsulated semiconductor device and electrically connected to the semiconductor device. The redistribution structure includes a first dielectric layer and a first redistribution circuit layer. The first dielectric layer includes a first via opening. The first redistribution circuit layer fills the first via opening and extends over the first dielectric layer. A vertical distance between a highest point of an upper surface of the first redistribution circuit layer and a lowest point of the upper surface of the first redistribution circuit layer is substantially equal to or smaller than 0.5 µm.

In accordance with some embodiments of the disclosure, a method of manufacturing a semiconductor package includes the following steps. An encapsulated semiconductor device is formed on a carrier, wherein the encapsulated semiconductor device includes a semiconductor device encapsulated by an encapsulating material. A redistribution structure is formed over the encapsulated semiconductor device, wherein forming the redistribution structure over the encapsulated semiconductor device includes the following steps. A first dielectric layer is formed on the encapsulated semiconductor device, wherein the first dielectric layer includes a first via opening. A first redistribution circuit layer is formed on the first dielectric layer by a plating process carried out at a current density of substantially from 4~6 amperes per square decimeter (ASD). An upper surface of the first redistribution circuit layer filling the first via opening is substantially coplanar with an upper surface of the rest of the first redistribution circuit layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a semiconductor die comprising an active surface and an electrical terminal vertically disposed on the active surface; and
a redistribution circuitry disposed on the active surface of the semiconductor die and connected to the electrical terminal, a top surface of the redistribution circuitry comprising a planar portion and a concave portion horizontally connected to the planar portion, the concave portion being directly over the electrical terminal, wherein a minimum distance measured from a lowest point of the concave portion to a virtual plane where the planar portion is located is equal to or smaller than 0.5 µm.

2. The semiconductor package of claim 1, wherein the redistribution circuitry is extended along a direction parallel to a diagonal of the active surface of the semiconductor die.

3. The semiconductor package of claim 1, wherein the concave portion of the redistribution circuitry has a curved cross-sectional profile.

4. The semiconductor package of claim 1, further comprising:
an insulating encapsulation laterally covering the semiconductor die, wherein the redistribution circuitry is further extended over the insulating encapsulation.

5. The semiconductor package of claim 4, further comprising:
a through insulating via penetrating through the insulating encapsulation and electrically coupled to the semiconductor die through the redistribution circuitry.

6. The semiconductor package of claim 5, further comprising:
additional semiconductor die disposed over a back surface of the semiconductor die opposite to the active surface, wherein the additional semiconductor die is electrically coupled to the through insulating via through a conductive bump.

7. The semiconductor package of claim 1, wherein the planar portion belongs to a circuit portion of the redistribution circuitry, the concave portion belongs to a first via portion of the redistribution circuitry, and the first via portion of the redistribution circuitry is in direct contact with the electrical terminal of the semiconductor die.

8. The semiconductor package of claim 7, wherein the redistribution circuitry further comprises a second via portion landing on the first via portion.

9. The semiconductor package of claim 8, wherein the first via portion and the second via portion are vertically aligned with one another.

10. The semiconductor package of claim 7, wherein the redistribution circuitry further comprises a second via portion landing on the circuit portion.

11. A semiconductor package, comprising:
a semiconductor die comprising a substrate and an electrical terminal;
an insulating encapsulation extending along sidewalls of the semiconductor die, wherein top surfaces of the electrical terminal and the insulating encapsulation are coplanar;
a redistribution circuitry disposed on the top surfaces of the electrical terminal and the insulating encapsulation, the redistribution circuitry being electrically connected to the semiconductor die, the redistribution circuitry comprising a circuit portion and a first via portion connected to the circuit portion, wherein the electrical terminal and the first via portion are sequentially stacked upon the substrate, and the first via portion comprises a recessed top surface with a recessed depth equal to or smaller than 0.5 μm.

12. The semiconductor package of claim 11, wherein the redistribution circuitry is extended along a direction parallel to a diagonal of a top surface of the semiconductor die.

13. The semiconductor package of claim 11, wherein the redistribution circuitry further comprises a second via portion directly on the first via portion.

14. The semiconductor package of claim 11, wherein the redistribution circuitry further comprises a second via portion laterally staggered from the first via portion.

15. The semiconductor package of claim 11, further comprising:
a through insulating via penetrating through the insulating encapsulation and electrically coupled to the semiconductor die through the redistribution circuitry.

16. The semiconductor package of claim 15, wherein the redistribution circuitry further comprises a second via portion directly on the through insulating via and comprising a recessed top surface.

17. A semiconductor package, comprising:
a semiconductor die comprising a first electrical terminal and a second electrical terminal;
an insulating encapsulation laterally encapsulating the semiconductor die; and
a redistribution circuitry disposed on the semiconductor die and the insulating encapsulation, the redistribution circuitry being electrically connected to the first and second electrical terminals, the redistribution circuitry comprising a first via portion landing on the first electrical terminal and a second via portion landing on the second electrical terminal, wherein at least one of the first and second via portions comprises a concave-curved top surface and is tapered in a direction toward the semiconductor die, and a minimum distance between a lowest point and a highest portion of the concave-curved top surface is equal to or smaller than 0.5 μm.

18. The semiconductor package of claim 17, further comprising:
a first conductive bump directly over and electrically coupled to the first via portion of the redistribution circuitry; and
a second conductive bump directly over and electrically coupled to the second via portion of the redistribution circuitry.

19. The semiconductor package of claim 17, wherein the redistribution circuitry further comprises a third via portion directly landing on the first via portion.

20. The semiconductor package of claim 17, wherein the redistribution circuitry further comprises:
a circuit portion connecting the first via portion to the second via portion; and
a third via portion landing on the circuit portion.

* * * * *